(12) United States Patent
Yoshimura et al.

(10) Patent No.: US 10,559,327 B2
(45) Date of Patent: Feb. 11, 2020

(54) BASE PLATE WITH ELECTRODEPOSITION COATING FILM AND METHOD FOR PRODUCING BASE PLATE

(71) Applicant: Nidec Corporation, Kyoto (JP)

(72) Inventors: Yuichiro Yoshimura, Kyoto (JP); Yoshinori Sakemoto, Kyoto (JP); Tokichi Ito, Kyoto (JP)

(73) Assignee: NIDEC CORPORATION, Kyoto (JP)

( * ) Notice: Subject to any disclaimer, the term of this patent is extended or adjusted under 35 U.S.C. 154(b) by 0 days.

(21) Appl. No.: 16/244,147

(22) Filed: Jan. 10, 2019

(65) Prior Publication Data

US 2019/0267044 A1    Aug. 29, 2019

(30) Foreign Application Priority Data

Feb. 28, 2018 (JP) ................. 2018-034127

(51) Int. Cl.
| | | |
|---|---|---|
| *G11B 33/00* | (2006.01) | |
| *G11B 33/02* | (2006.01) | |
| *B22D 25/02* | (2006.01) | |
| *B23P 15/00* | (2006.01) | |
| *G11B 25/04* | (2006.01) | |
| *H05K 5/04* | (2006.01) | |
| *G11B 33/14* | (2006.01) | |
| *G11B 33/12* | (2006.01) | |

(52) U.S. Cl.
CPC ............ *G11B 33/022* (2013.01); *B22D 25/02* (2013.01); *B23P 15/00* (2013.01); *G11B 25/043* (2013.01); *G11B 33/121* (2013.01); *G11B 33/1446* (2013.01); *H05K 5/04* (2013.01)

(58) Field of Classification Search
CPC ..... G11B 33/121; G11B 33/1446; H05K 5/04
USPC .................... 360/99.16; 361/679.31, 679.33
See application file for complete search history.

(56) References Cited

U.S. PATENT DOCUMENTS

| 6,417,985 B1 | 7/2002 | Noda | |
|---|---|---|---|
| 8,089,721 B1 * | 1/2012 | Andrikowich | ..... G11B 33/1466 |
| | | | 310/67 R |
| 2001/0043430 A1 * | 11/2001 | Noda | ................. G11B 25/043 |
| | | | 360/99.18 |

(Continued)

*Primary Examiner* — Jefferson A Evans
(74) *Attorney, Agent, or Firm* — Keating & Bennett

(57) ABSTRACT

A base plate defines a portion of a housing of a disk drive device. The housing accommodates therein a disk, a spindle motor that rotationally drives the disk about a center axis that extends in a vertical direction, and an access portion that carries out at least one of reading or writing of information with respect to the disk. The base plate includes a cast metal base body and an electrodeposition coating film that covers the surface of the base body. The base body includes a bottom plate portion extending from the center axis to an outward in a radial direction and a wall portion with a rectangular or substantially rectangular shape viewed in the axial direction upward from an outer circumference portion of the bottom plate portion. An outside surface of the wall portion includes a coated surface covered with the electrodeposition coating film, a processing surface which is flat and on which a casting material is exposed from the electrodeposition coating film, and a parting line. The processing surface extends in the axial direction in contact with the parting line or across the parting line.

10 Claims, 10 Drawing Sheets

(56) References Cited

U.S. PATENT DOCUMENTS

| | | | | |
|---|---|---|---|---|
| 2006/0125333 | A1* | 6/2006 | Wehner | H02K 5/20 |
| | | | | 310/54 |
| 2008/0020185 | A1 | 1/2008 | Macatangay et al. | |
| 2010/0183869 | A1* | 7/2010 | Lin | B22D 17/00 |
| | | | | 428/332 |
| 2011/0122567 | A1* | 5/2011 | Cheah | G11B 25/043 |
| | | | | 361/679.33 |
| 2013/0050873 | A1* | 2/2013 | Abe | H02K 1/146 |
| | | | | 360/99.08 |
| 2013/0335859 | A1* | 12/2013 | Tatsumi | G11B 33/02 |
| | | | | 360/99.08 |
| 2014/0134453 | A1* | 5/2014 | Wu | B32B 15/01 |
| | | | | 428/614 |
| 2015/0138670 | A1* | 5/2015 | Sato | H02K 3/50 |
| | | | | 360/99.08 |
| 2015/0235667 | A1* | 8/2015 | Sugiki | G11B 19/2036 |
| | | | | 384/120 |
| 2016/0163349 | A1* | 6/2016 | Yawata | G11B 19/2009 |
| | | | | 219/121.85 |
| 2016/0164365 | A1* | 6/2016 | Yoneda | H02K 5/10 |
| | | | | 310/71 |
| 2016/0329081 | A1* | 11/2016 | McGuire, Jr. | G11B 25/043 |
| 2017/0038641 | A1* | 2/2017 | Yamazaki | G02F 1/133555 |
| 2017/0053678 | A1* | 2/2017 | Albrecht | G11B 25/043 |
| 2018/0038309 | A1* | 2/2018 | Sasaki | F02F 3/10 |
| 2018/0123413 | A1* | 5/2018 | Akahori | G11B 19/2036 |
| 2019/0093234 | A1* | 3/2019 | Sakurada | G11B 25/043 |
| 2019/0287573 | A1* | 9/2019 | Terasaki | G11B 33/123 |

* cited by examiner

BASE PLATE WITH ELECTRODEPOSITION COATING FILM AND METHOD FOR PRODUCING BASE PLATE

CROSS REFERENCE TO RELATED APPLICATIONS

This application claims the benefit of priority to Japanese Patent Application No. 2018-034127 filed on Feb. 28, 2018. The entire contents of this application are hereby incorporated herein by reference.

BACKGROUND OF THE INVENTION

1. Field of the Invention

The present disclosure relates to a base plate and a method for producing a base plate.

2. Description of the Related Art

Conventionally, a disk drive device that includes a disk, a spindle motor, and an access portion is known. For example, Japanese Patent Publication No. 2000-156077 discloses a magnetic disk device that is a disk drive device of this type.

This magnetic disk device includes as mechanism components a magnetic disk that is a magnetic recording medium, a spindle motor that rotationally drives the magnetic disk, a magnetic head that carries out recording and reproducing of information with respect to the surface of the magnetic disk, and an actuator that carries out positioning and driving of the magnetic head. In addition, this magnetic disk device has a base on which the mechanism component described above is mounted. The base includes an overhang portion on the both sides of the portion on which the mechanism component is mounted, and the overhang portion has a multi-purpose space. In this disk drive device, it is possible to use the overhang portion that is the multi-purpose space for a removable mechanism of a main body device and the like.

Incidentally, in a case where it is desired to provide an intermediate work product that is a base in the middle of being produced with cutting, welding, or any other kind of processing, in general, it is necessary to apply a clamping force onto the work so as to hold down the intermediate work product. According to the technical idea of the disk drive device described above, it may be considered that a clamp surface or the like that functions as a portion that receives a clamping force to hold down the intermediate work product is arranged in the overhang portion.

However, in a case where the overhang portion is provided with a portion that has a clamp surface or the like, while it is possible to relatively freely layout the clamp surface, a space in which the overhang portion is arranged is essential and the disk drive device becomes large in size. Therefore, in place of this, it may be considered that the member that has the clamp surface or the like is arranged in a portion of a base on which the mechanism component described above is mounted. However, in this case, there is a possibility of a significant change in the layout of the clamp surface and incapability of clamping the intermediate work product with a sufficient force. As a result, there is a worry about failing to carry out an accurate cutting with respect to the intermediate work product, resulting in reduction of the quality of the base.

SUMMARY OF THE INVENTION

The problems relating to the present disclosure is as described above, and methods for solving this problem will next be explained.

The present disclosure sets forth a base plate that defines a portion of the housing of the disk drive device. The housing accommodates therein a disk, a spindle motor that rotationally drives the disk about the center axis that extends in a vertical direction, and an access portion that carries out at least one of reading or writing information with respect to the disk. The base plate includes a base body that is a cast metal and an electrodeposition coating film that covers the surface of the base body. The base body includes a bottom plate portion that stretches from the center axis outward in a radial direction and a wall portion that extends in a rectangular or substantially rectangular shape viewed in the axial direction upward from an outer circumference portion of the bottom plate portion. An outside surface of the wall portion includes a coated surface that is covered with the electrodeposition coating film, a processing surface which is flat and on which a casting material is exposed from the electrodeposition coating film, and a parting line. The processing surface extends in the axial direction in contact with the parting line or across the parting line.

The above and other elements, features, steps, characteristics and advantages of the present disclosure will become more apparent from the following detailed description of the preferred embodiments with reference to the attached drawings.

DETAILED DESCRIPTION OF THE PREFERRED EMBODIMENTS

Examples of embodiments of the present disclosure will be explained below with reference to drawings. It is to be noted that in the present disclosure, the direction that is parallel to the rotation axis of a disk is often referred to as an "axial direction", the direction that is orthogonal to the rotation axis of a disk is often referred to as a "radial direction", and the direction that is along a circular arc about the rotation axis of a disk is often referred to as a "circumferential direction". In addition, in the present disclosure, the shape of each portion and positional relationship are often explained with the axial direction being set in a vertical direction and with the side on which the cover is attached to the base member being up. However, it is not intended that this definition of the vertical direction limits the orientation in use of a disk drive device according to the present disclosure.

Figure 1:
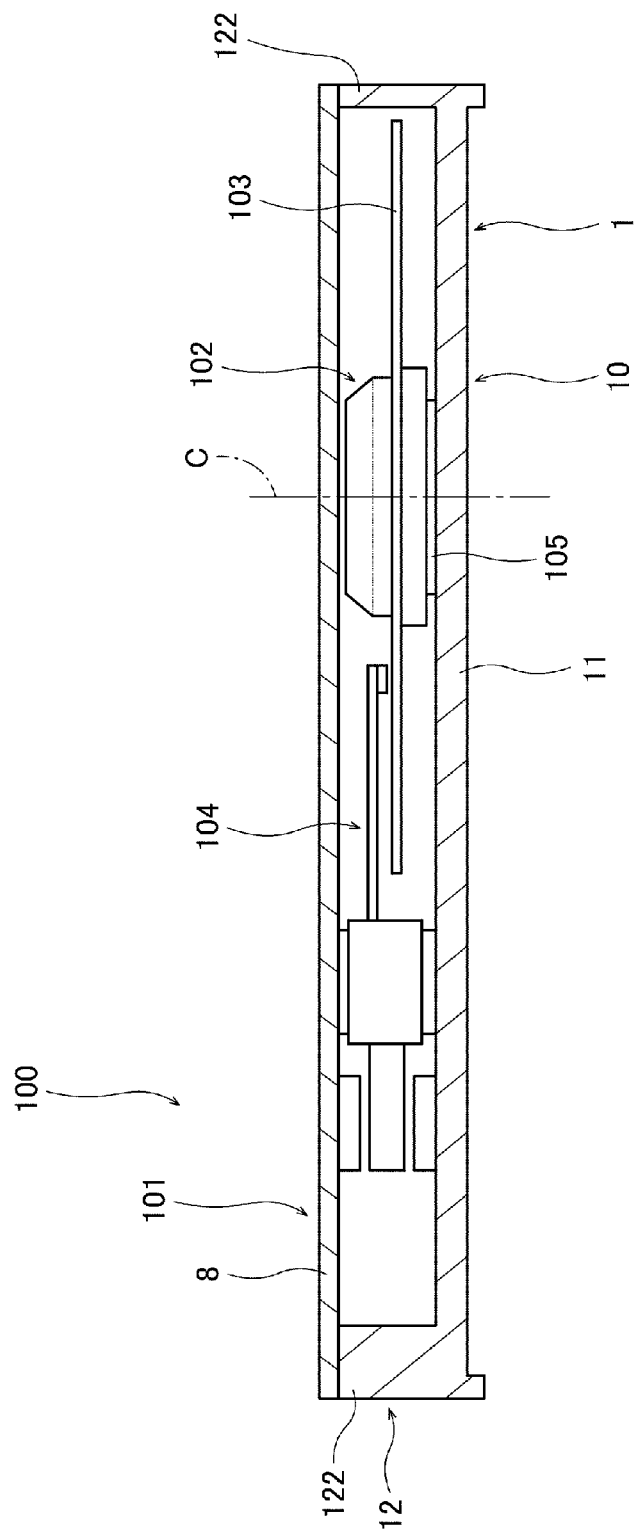
FIG. 1 is a longitudinal sectional view of a disk drive device.

FIG. 1 is a longitudinal sectional view of a disk drive device 100. The disk drive device 100 is a hard disk drive. The disk drive device 100 includes a housing 101, a spindle motor 102, a disk 103, an access portion 104, and a support portion 105. The spindle motor 102, the disk 103, the access portion 104, and the support portion 105 are accommodated in the housing 101.

The spindle motor 102 is supported by a base plate 1 described later that the housing 101 includes. The spindle motor 102 retains the disk 103 and rotationally drives the disk 103 about a center axis C. The spindle motor 102 is supported by the support portion 105 that is provided in a bottom plate portion 11 described later of the housing 101. The disk 103 is a medium in which information is recorded. The access portion 104 approaches and separates with respect to the surface of the disk 103 so as to magnetically carry out at least one of reading information recorded in the disk 103 or writing information into the disk 103.

The housing 101 includes the base plate 1 and a cover 8. The base plate 1 has an opening in its upper portion and the cover 8 is fitted with the opening, so that the housing 101 is configured. The base plate 1 and the cover 8 are assembled together without losing airtightness in the housing 101. The inner space of the housing 101 may be filled with, for example, helium gas, which is a gas with the density lower than air. However, the present disclosure is not limited to this and the inner space of the housing 101 may be filled with hydrogen gas, air, or the like.

Figure 2:
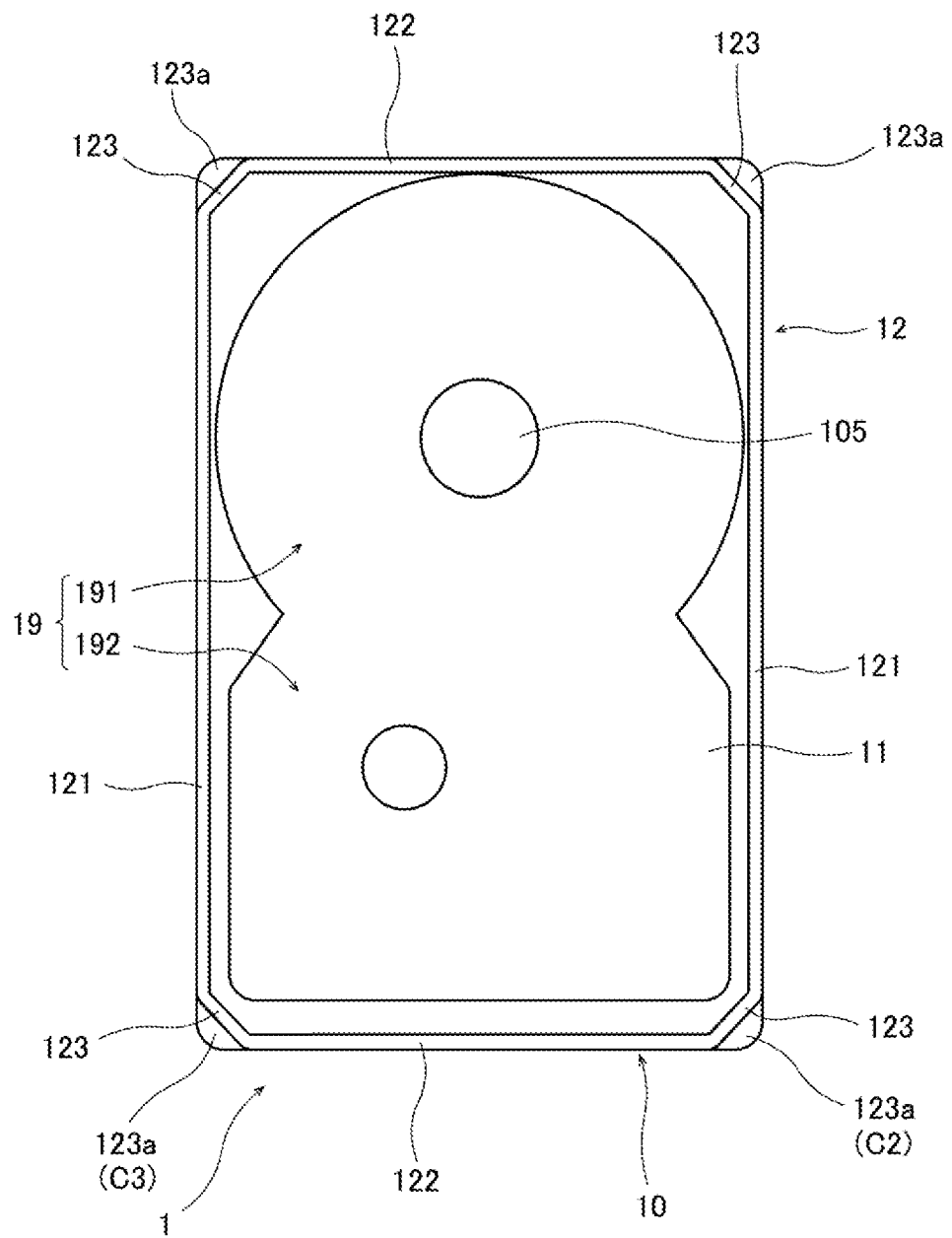
FIG. 2 is a top view of a base plate.
Figure 3:
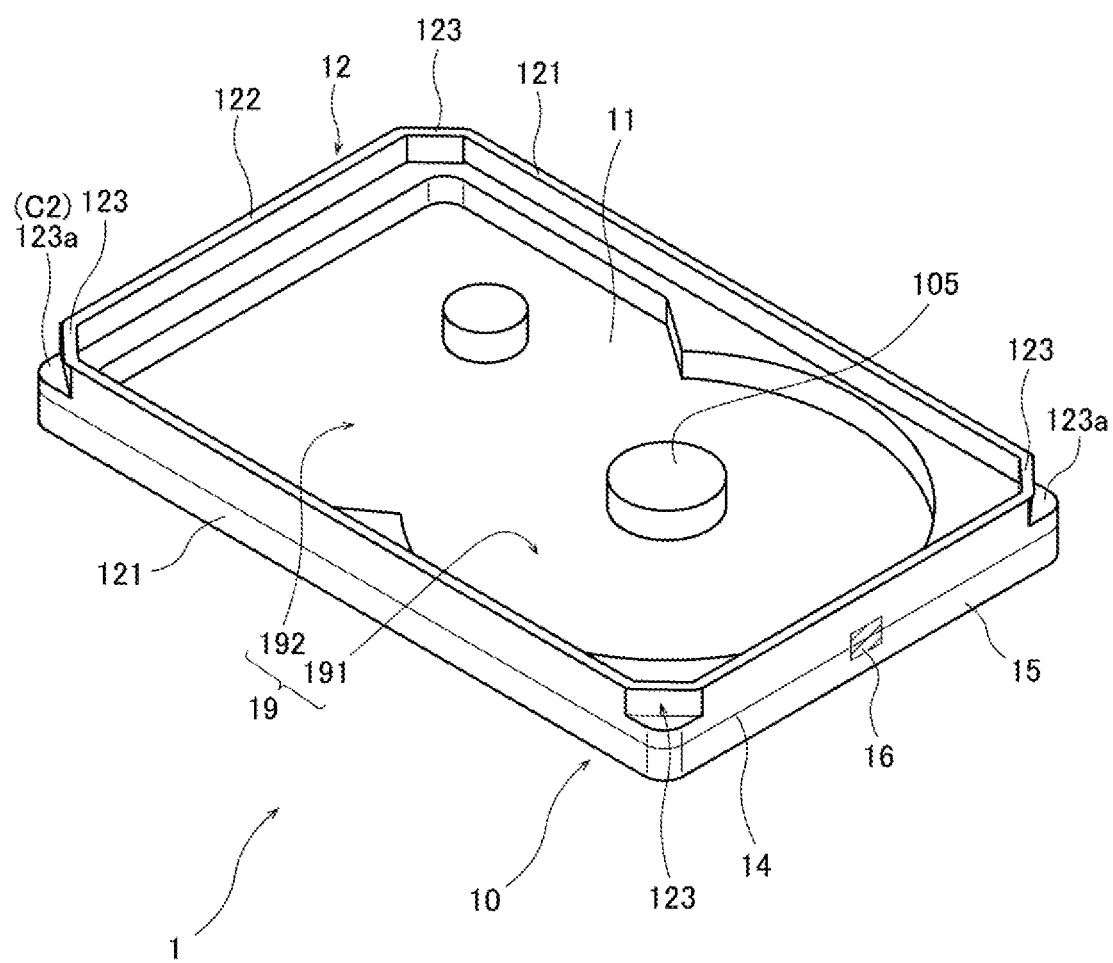
FIG. 3 is a perspective view of a base plate according to a first embodiment preferred embodiment of the present invention.
Figure 5:
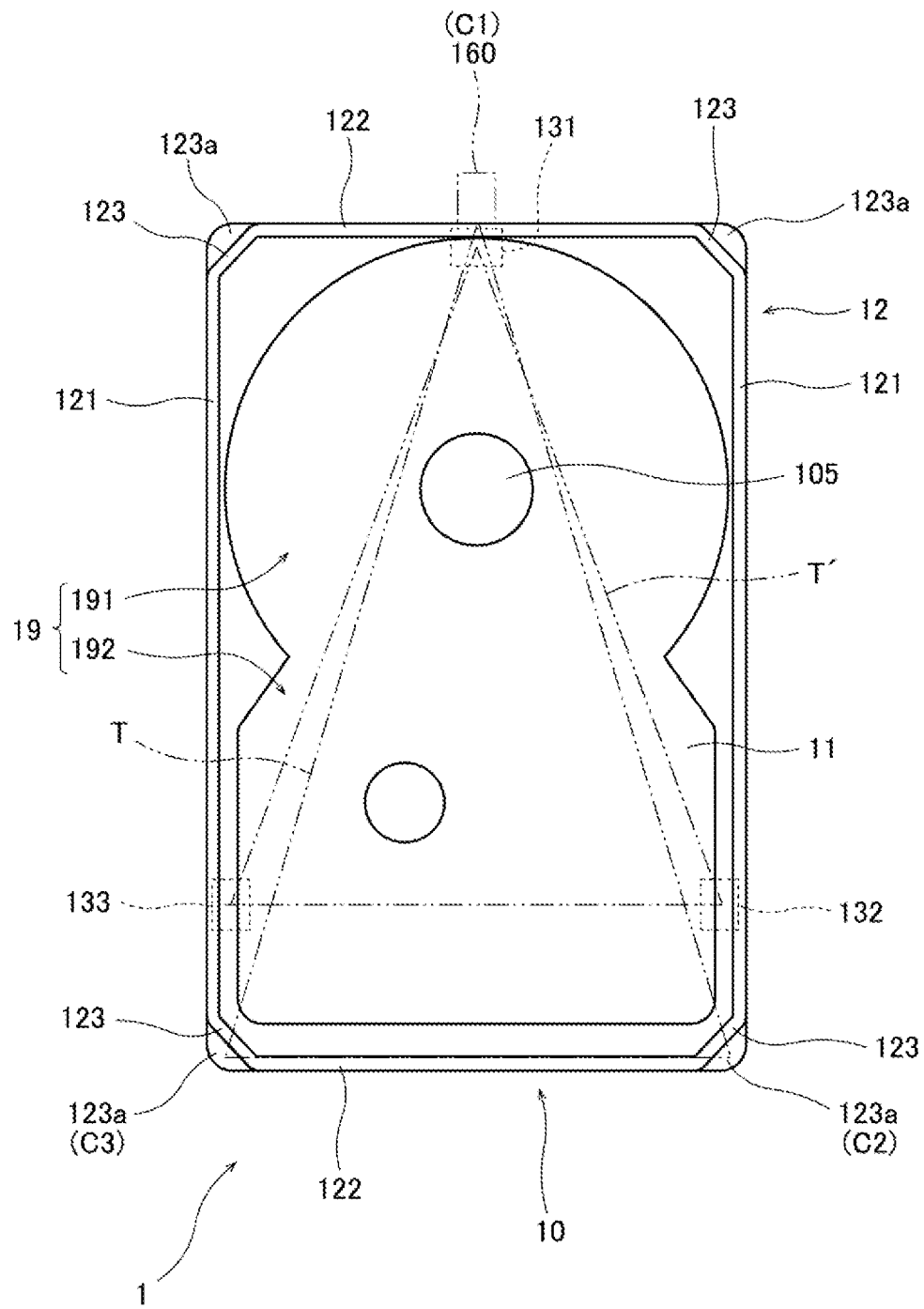
FIG. 5 is a top view that presents a configuration of a base plate according to the first embodiment preferred embodiment of the present invention.

The configuration of a base plate according to the first embodiment 1 will be explained below more in details. FIG. 2 is a top view of the base plate 1. FIG. 3 is a perspective view of a base plate according to the first embodiment 1. FIG. 5 is a top view that presents configuration more in detail of the base plate 1 according to the present embodiment.

The base plate 1 is produced by providing the base intermediate described later that is a cast product with coating of an electrodeposition coating film, cutting work, and the like. Due to this, the base plate 1 includes mainly a base body 10 and an electrodeposition coating film that covers the surface of the base body 10. The base body 10 is molded by casting in the production process described later. The base body 10 has the bottom plate portion 11 and a wall portion 12. The bottom plate portion 11 stretches from the center axis C to an outward in a radial direction in a substantially rectangular shape. The wall portion 12 extends in a substantially rectangular shape viewed in the axial direction upward from an outer circumference portion of the bottom plate portion 11.

The wall portion 12 has a pair of long side wall portions 121, which correspond to the long side of the rectangle, a pair of short side wall portions 122, which correspond to the short side that is shorter than the long side of the rectangle, and corner wall portions 123, which are provided at connection points of the long side wall portions 121 and the short side wall portions 122. The corner wall portions 123 connect the connection points of the long side wall portions 121 and the short side wall portions 122 with straight lines that are inclined to any of the long side wall portion 121 and the short side wall portion 122 when viewed in the axial direction. However, the corner wall portions 123 may not necessarily be in a linear manner in a planar view and in place of this, for instance, the corner wall portions 123 may connect the long side wall portion 121 and the short side wall portion 122 in a circular arc manner. As presented in FIG. 2 and FIG. 3, each of the corner wall portions 123 has a stepped surface 123a, which stretches outside of an area surrounded by the wall portion 12 when viewed in the axial direction and at a position below the upper end face of the wall portion 12.

As presented in FIG. 2 and FIG. 3, the base body 10 has a space 19 that is surrounded by the bottom plate portion 11 and the wall portion 12. The space 19 has a motor accommodating portion 191 and an access portion accommodating portion 192. The motor accommodating portion 191 is provided with the support portion 105 and the spindle motor 102 and the disk 103 are accommodated therein. In the access portion accommodating portion 192, the access portion 104 is accommodated.

As presented in FIG. 3, the outside surface of the wall portion 12 is provided with a continuity of parting line 14 in the whole circumference (circumferential direction) along the long side wall portion 121, the short side wall portion 122, and the corner wall portion 123. The parting line 14 is a trace of a boundary portion of the molds when the cast metal (base intermediate) that becomes the base body 10 after the subsequent process is molded by a pair of molds.

The outside surface of the base body 10 has a coated surface 15 that is covered with an electrodeposition coating film and a processing surface 16 on which the casting material is exposed from the electrodeposition coating surface. In FIG. 3, of the outside surface of the base body 10, the processing surface 16 is shown with hatching and, of the outside surface of the base body 10, the coated surface 15 is shown without hatching.

The coated surface 15 is a surface of the base body 10 that is covered with an electrodeposition coating film. The electrodeposition coating film is an insulating film of an epoxy resin for instance. The processing surface 16 is a surface of the base body 10 on which the casting material is exposed from the electrodeposition coating film. It is to be noted that the outer surface of the casting material of the processing surface 16 may be covered with an impregnation agent or the like for the purpose of ensuring airtightness.

The processing surface 16 is a flat plane. The processing surface 16 of the present embodiment is located in the center portion of the longitudinal direction of the outside surface of the short side wall portion 122 of the side that is close to the support portion 105 of the pair of short side wall portions 122. As presented in FIG. 3, the processing surface 16 extends in the axial direction across the parting line 14. However, the mode of the processing surface 16 is not limited to this. In place of the above, for example, the processing surface may be in contact with the parting line 14 and extend in any one of the bottom plate portion 11 side and the cover 8 side.

Figure 4:
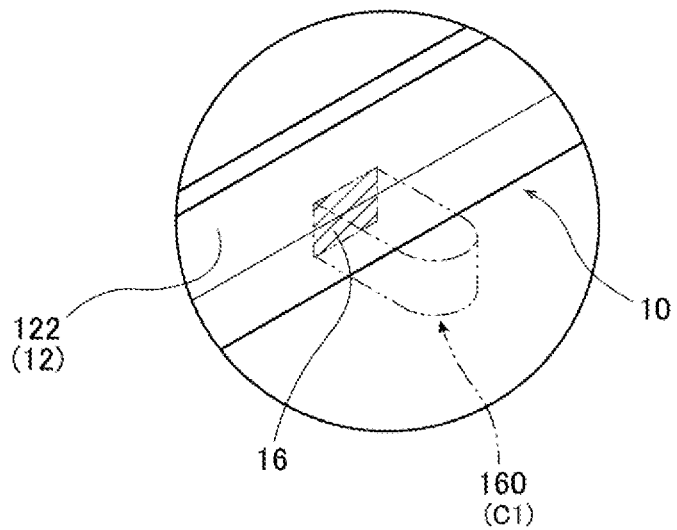
FIG. 4 is a perspective view that presents a protruding portion that protrudes in a production process in an outside of a wall portion of a base body of a base plate according to the first embodiment preferred embodiment of the present invention.

The processing surface 16 is a trace of a protruding portion 160 that was cut down, which extended outwardly to the outside of the short side wall portion 122 in the base body 10 which was molded by casting, more strictly, in the base intermediate described later. FIG. 4 presents the protruding portion 160 that was temporality formed in the production process. The protruding portion 160 is temporarily formed in order to function as a first clamp surface C1 on which a clamping force of the axial direction is applied to the base body 10 at the time of cutting work of the wall portion 12 in the production process. Accordingly, the protruding portion 160 does not exist in the base plate 1 as a finished product.

As presented in FIG. 5, the stepped surfaces 123a of the corner wall portions 123 that are arranged at the both end portions of the longitudinal direction of the short side wall portion 122 that is opposite to the short side wall portion 122 to which the processing surface 16 is provided function as a second clamp surface C2 and a third clamp surface C3. In the production process, at the time of cutting work of the wall portion 12, a clamping force in the axial direction is applied also to the second clamp surface C2 and the third clamp surface C3 in addition to the upper surface of the protruding portion 160 as the first clamp surface C1.

The lower surface (bottom surface) of the bottom plate portion 11 is provided with three datum surfaces 131, 132, and 133 as reception surfaces with respect to jigs and the like. The first datum surface 131 is a flat surface that is provided along the short side wall portion 122 in an immediate inside of the processing surface 16 (the protruding portion 160).

The second datum surface 132 is provided in a neighborhood of the stepped surface 123a, which functions as the second clamp surface C2, in a position along one of the long side wall portions 121. The second datum surface 132 is a flat surface that is provided on the lower surface of the bottom plate portion 11.

The third datum surface 133 is provided in a neighborhood of the stepped surface 123a, which functions as the third clamp surface C3, in a position along the other one of the long side wall portions 121. The third datum surface 133 is a flat surface that is provided on the lower surface of the bottom plate portion 11.

The first to third datum surfaces 131, 132, and 133 are provided in a neighborhood of the first to third clamp surfaces C1, C2, and C3, respectively, viewed in the axial direction. Accordingly, in the production process, at the time of cutting work of the wall portion 12, while the base body 10 is supported at three points with respect to the jig by the first to third datum surfaces 131, 132, and 133, it is possible to apply a clamping force in the axial direction to the three points of the first to third clamp surfaces C1, C2, and C3 and hold down the base body 10. Due to this, the cutting process can be efficiently provided to the base body 10 while suppressing deformation and warpage in the base body 10 from being generated.

Figure 6:
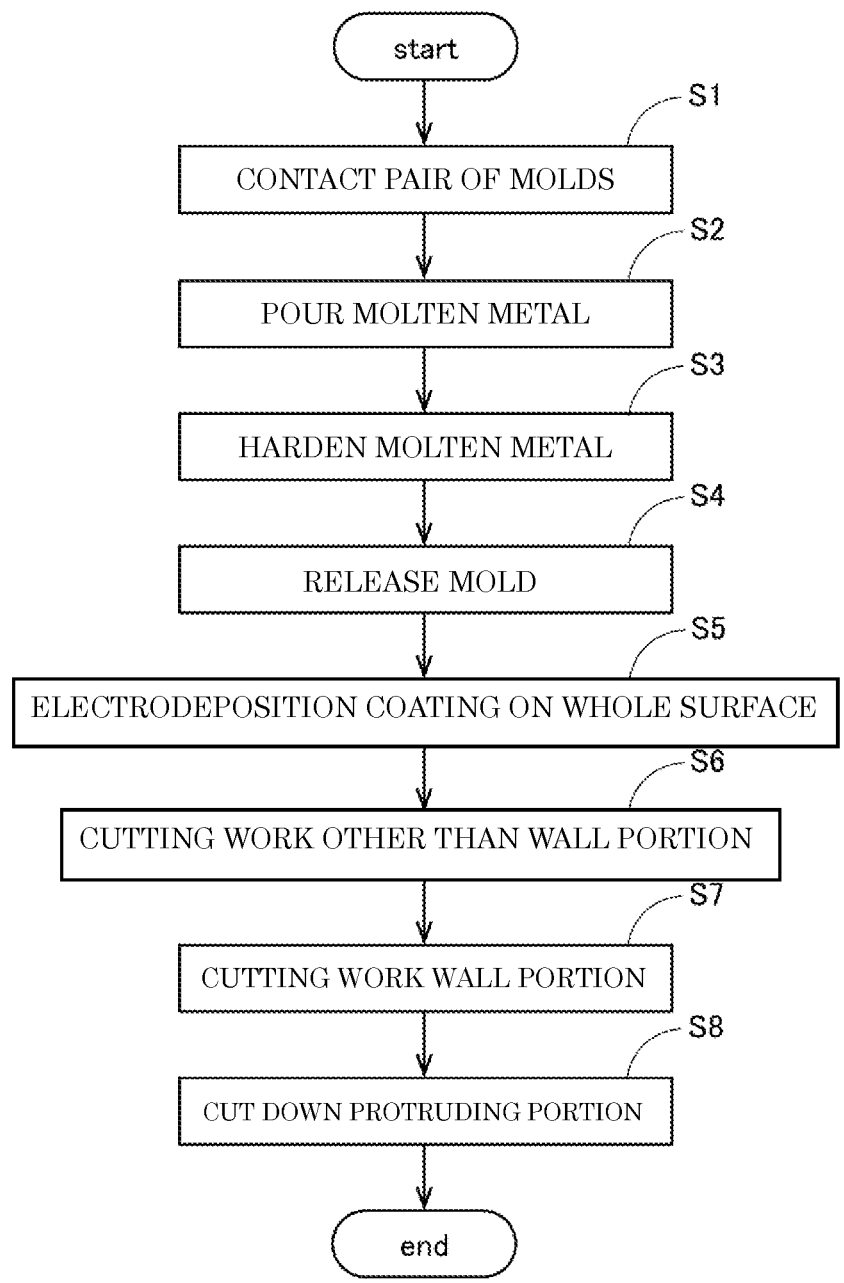
FIG. 6 is a view that presents a production process of a base plate according to the first embodiment preferred embodiment of the present invention.

A brief explanation on the production process of the base plate 1 will be given below with reference to FIG. 6. FIG. 6 is a flow chart that presents the production process of the base plate 1.

First, a cavity through which molten metal is supplied is formed by causing opposite surfaces of a pair of molds to contact each other (Step S1). This cavity has a shape that corresponds to the shape including the datum surfaces 131, 132, and 133, the protruding portion 160, and the like of the base body (base intermediate).

Next, the molten metal is poured into the cavity that has been formed (Step S2). The molten metal is, for instance, a molten aluminum. The molten metal is poured into the cavity via a runner that causes the cavity between the pair of molds to communicate with the outside.

After the molten metal is filled in the cavity, then the molten metal is hardened by cooling it (Step S3). When the molten metal is hardened, a base intermediate that is in a state where the base body 10 is attached with the protruding portion 160 is formed. After that, the pair of molds is opened and this base intermediate is released from the molds (Step S4).

Followed by that, the surface of the base intermediate is provided with an electrodeposition coating (Step S5). More specifically, for example, the base intermediate is immersed into the coating material of an epoxy resin and an electric current is caused to flow between the coating material and the base intermediate, so that the coating material is adhered to the entire surface of the base intermediate. Due to this, the electrodeposition coating film is formed on the surface of the base intermediate.

Subsequently, cutting work is provided to a part other than the wall portion 12 in a state where at least one of the pair of long side wall portions 121 or the pair of short side wall portions 122 is clamped (Step S6). More specifically, cutting work is provided to the surface of the bottom plate portion 11 that is exposed in the space 19.

Followed by that, the first to third datum surfaces 131, 132, and 133 of the base intermediate are supported by jigs, and a clamping force in the axial direction is applied to the first to third clamp surfaces C1, C2, and C3, so that cutting work is provided to the wall portion 12 (Step S7). At this time, all of the three clamp surfaces C1, C2, and C3, to which the clamping force is applied, are arranged outside of the wall portion 12, and hence it is possible to cause the cutting blade to touch the wall portion 12 from inside, outside, and upper side and it is possible to provide the cutting work all over the whole circumference of the wall portion 12.

After that, the protruding portion 160, which functioned as the first clamp surface C1, is cut down using a cutting tool such as an end mill. It is to be noted that at this moment, the runner described above is also cut down. Due to this, as presented in FIG. 3, the processing surface 16 on which the casting material is exposed from the electrodeposition coating film is formed.

As presented above, the processing surface 16 of the present embodiment is provided on the outside surface of the wall portion 12 and extends in the axial direction across the parting line 14. The processing surface 16 indicates that in the cutting process (Step S7) after casting, the protruding portion 160 existed in the outside of the processing surface 16. In addition, in the cutting process (Step S7), it is possible to clamp the protruding portion 160. Due to this, it is possible to carry out an accurate cutting process with respect to the cast metal. As a result, it is possible to obtain the base plate 1 with high quality. Furthermore, it is possible to suppress an increase in the outer shape of the base plate 1.

In addition, the processing surface 16 of the present embodiment is located on the outside surface of one of the pair of short side wall portions 122. Due to this, it is possible to clamp the protruding portion 160 that existed outside of the wall portion 12 in the cutting process (Step S7) after casting. This allows the cutting work of the wall portion 12 to be carried out all over the whole circumference.

In addition, in the base plate 1 of the present embodiment, the wall portion 12 includes the corner wall portion 123, which connects the connection point of the long side wall portion 121 and the short side wall portion 122, and the corner wall portion 123 has the stepped surface 123a. Due to this, in the cutting process (Step S7) after casting, it is possible to clamp the cast metal (base intermediate) using the protruding portion 160 (C1), which had existed outside of the processing surface, and the stepped surfaces 123a (C2 and C3). Thus, it is possible to more stably support the cast metal.

In addition, in the base plate 1 of the present embodiment, the processing surface 16 is located in the center portion of the longitudinal direction of the short side wall portion 122, and the stepped surface 123a is located in the pair of corner wall portions 123 of the both end portions of the short side wall portion 122 that is opposed to the short side wall portion 122. Due to this, as presented in FIG. 5, it is possible to more stably clamp the cast metal with the three points of the protruding portion 160 (C1), which is arranged on the vertex of a virtual triangle T, and the pair of stepped surfaces 123a (C2 and C3). As a result, in combination with the arrangement of the datum surfaces 131, 132, and 133, the cast metal becomes less susceptible to an inclination in the posture and becomes less susceptible to be unsteady.

In addition, in the base plate 1 of the present embodiment, the processing surface 16 is located in the center portion of the longitudinal direction of the short side wall portion 122. Due to this, the cast metal (base intermediate) is clamped in the center portion of the short side wall portion 122 at one end portion of the longitudinal direction thereof, while the cast metal (base intermediate) is clamped in the both end portions of the short side wall portion 122 at the other end portion of the longitudinal direction thereof. As a result, the cast metal (base intermediate) is planarly clamped in a balanced manner at the three points on the vertices of the isosceles triangle with small vertex angles.

In addition, the base plate 1 of the present embodiment further includes the support portion 105, which supports the spindle motor 102. Then, the processing surface 16 is located in the short side wall portion 122 on a side that is close to the support portion 105 of the pair of short side wall portions 122.

Here, in general, in the longitudinal direction of the disk drive device 100, the access portion 104 is arranged on a side that is opposed to the side on which the disk 103 is arranged. In addition, in the axial direction, a circuit board for operating and controlling the access portion 104 is arranged on a side that is opposed to the access portion 104 across the bottom plate portion 11. For this reason, on a side that is far from the support portion 105 in the longitudinal direction of the disk drive device 100, it is difficult to lay out the clamp surface C1 (the protruding portion 160) on which the clamping force is applied and the datum surface 131 corresponding thereto. However, in a configuration of the present embodiment, it is possible to lay out the protruding portion 160 and the datum surface 131 corresponding thereto in a neighborhood of the short side wall portion 122 of a side that is close to the disk 103. Therefore, it is possible to carry out an accurate cutting work with respect to a cast metal (base intermediate) without making a significant change in the layout and the like of a conventional circuit board.

In addition, in the base plate 1 of the present embodiment, when viewed in the axial direction, the virtual triangle T, which is formed with each of the processing surface 16 and the two stepped surfaces 123a as a vertex, is an isosceles triangle. Due to this, it is possible to clamp the base intermediate as a cast metal in a geometrically ideal position. In addition, it is possible to support the base intermediate with respect to the jig and the like in a geometrically ideal position by arranging the datum surfaces 131, 132, and 133 in positions substantially corresponding to each of the vertices of the virtual triangle T of the lower surface of the bottom plate portion 11. Due to this, it is possible to prevent deformation and warpage in the cast metal from being generated due to cutting resistance and clamping force as much as possible.

In addition, the method for producing the base plate 1 disclosed in the present embodiment includes the steps of a), b), and c) below. In a), a base intermediate that becomes the base plate 1 in the later process, the base intermediate having the protruding portion 160 on the outside surface of the wall portion 12, is formed by the pair of molds (Steps S1 to S4). In b), after the a), the base intermediate is provided with a cutting work (Step S7), while the base intermediate is supported with a clamping force in the axial direction being applied to the protruding portion 160. In c), after the b), the protruding portion 160 is cut down.

According to this production method, at the time of cutting process in the process of producing the base plate 1, it is possible to cause the cutting blade to touch the whole circumference of the wall portion 12, while clamping the protruding portion 160. Therefore, it is possible to provide an accurate cutting work, while preventing the position of the cast metal from being displaced due to the cutting resistance or deformation and warpage from being generated. Moreover, since the protruding portion 160 is cut down in the subsequent step of the cutting process, an unnecessary part is not left behind in the finished product (the base plate 1) and thus it is possible to suppress an increase in the outer shape of the base plate 1.

Figure 7:
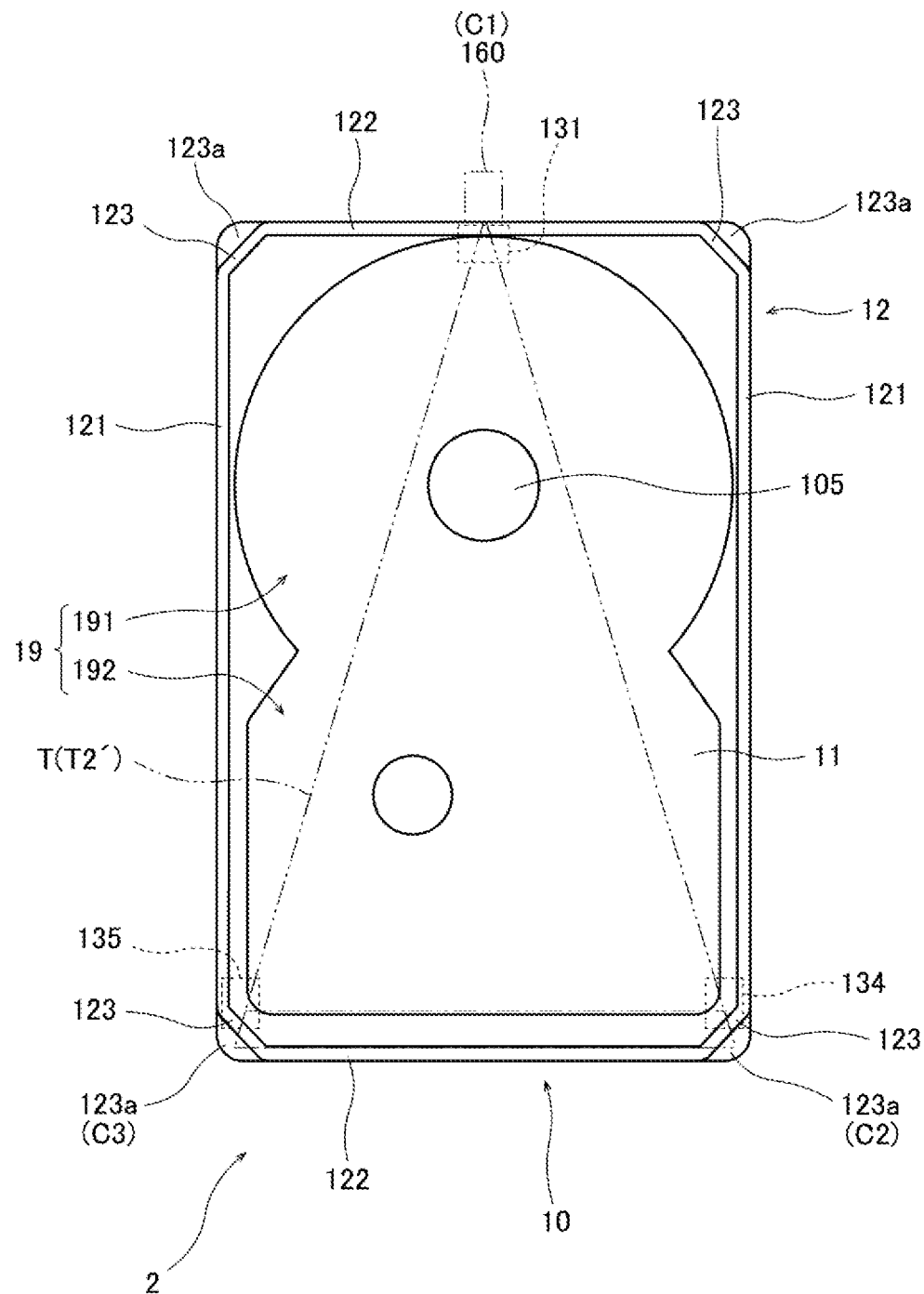
FIG. 7 is a top view that presents a configuration of a base plate according to a second embodiment preferred embodiment of the present invention.

Next, the configuration of a base plate 2 according to the second embodiment will be explained with reference to FIG. 7. FIG. 7 is a top view that schematically presents the configuration of the base plate 2 according to the present embodiment. It is to be noted that in the below, a member that has a configuration or function similar to that of the embodiment described above may be given an identical explanation and a redundant explanation may be omitted. This is also true for the other embodiments and modifications that will be explained hereinafter. In addition, in the explanation of the embodiments hereinafter, points that are different from those of the embodiment described above are mainly explained.

The base plate 2 according to the present embodiment includes a datum surface 134, in place of the datum surface 132, as a datum surface that corresponds to the stepped surface 123a (C2). In addition, the base plate 2 includes a datum surface 135, in place of the datum surface 133, as a datum surface that corresponds to the stepped surface 123a (C3).

The datum surface 134 is provided in a position that is substantially overlapping with the stepped surface 123a as the clamp surface C2 when viewed in the axial direction. The datum surface 135 is provided in a position that is substantially overlapping with the stepped surface 123a as the clamp surface C3 when viewed in the axial direction. On the other hand, the datum surface 131 is the same as that of the first embodiment.

A virtual triangle T2', which is formed with the datum surfaces 131, 134, and 135 as vertices, is substantially overlapping with the virtual triangle T, which is formed with the protruding portion 160 (C1) and the pair of stepped surfaces 123a (C2 and C3) as vertices. In addition, these virtual triangles T and T2' are isosceles triangles.

Due to this, it is possible to clamp the cast metal (base intermediate) in a geometrically ideal position. In addition, the datum surfaces 131, 134, and 135 are arranged in positions that are substantially corresponding to the respective vertices of the virtual triangle T formed by the three clamp surfaces C1, C2, and C3 of the lower surface of the bottom plate portion 11, and hence it is possible to support the cast metal (base intermediate) with respect to the jig and the like, while suppressing it from getting inclined in the posture and getting unsteady. As a result, it is possible to prevent deformation and warpage in the cast metal more from being generated due to cutting resistance and clamping force.

Figure 8:
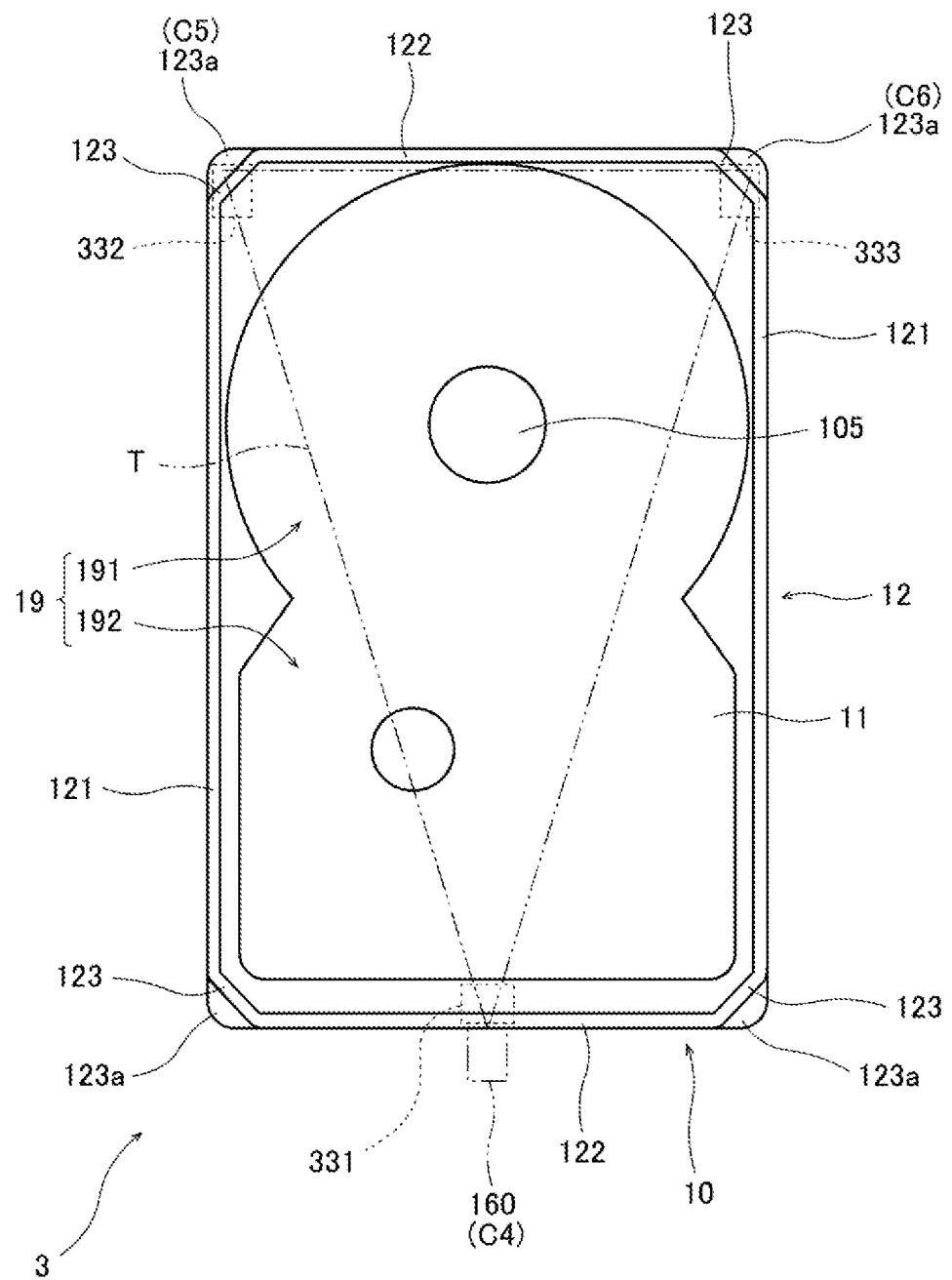
FIG. 8 is a top view that presents a configuration of a base plate according to a third embodiment preferred embodiment of the present invention.

The configuration of a base plate 3 according to the third embodiment will be explained below with reference to FIG. 8. FIG. 8 is a top view that schematically presents the configuration of the base plate 3 according to the present embodiment.

The base plate 3 according to the present embodiment includes a processing surface (not shown) that is a trace of the protruding portion 160 in the short side wall portion 122 of a side that is far from the support portion 105. The upper surface of the protruding portion 160, which existed outside of the processing surface functions as a clamp surface C4. In addition, the stepped surfaces 123a of the both end portions of the longitudinal direction of the short side wall portion 122 that is opposed to the short side wall portion 122 on which this processing surface is provided function as clamp surfaces C5 and C6.

The lower surface of the bottom plate portion 11 of the base plate 3 is provided with a datum surface 331, which corresponds to the protruding portion 160 (C4), and datum surfaces 332 and 333, which correspond to the stepped surfaces 123a (C5 and C6). The datum surface 331 is provided in a neighborhood of the processing surface that is a trace of the protruding portion 160. The datum surface 332 is provided in a position that is substantially overlapping with the stepped surface 123a (C5) when viewed in the axial direction. The datum surface 333 is provided in a position that is substantially overlapping with the stepped surface 123a (C6) when viewed in the axial direction.

Also according to the present embodiment, in the cutting process (Step S7) after casting, it is possible to stably support a cast metal (base intermediate) by the three datum surfaces 331, 332, and 333 and it is possible to stably clamp the cast metal by the three clamp surfaces C4, C5, and C6 without generating deformation and warpage.

Figure 9:
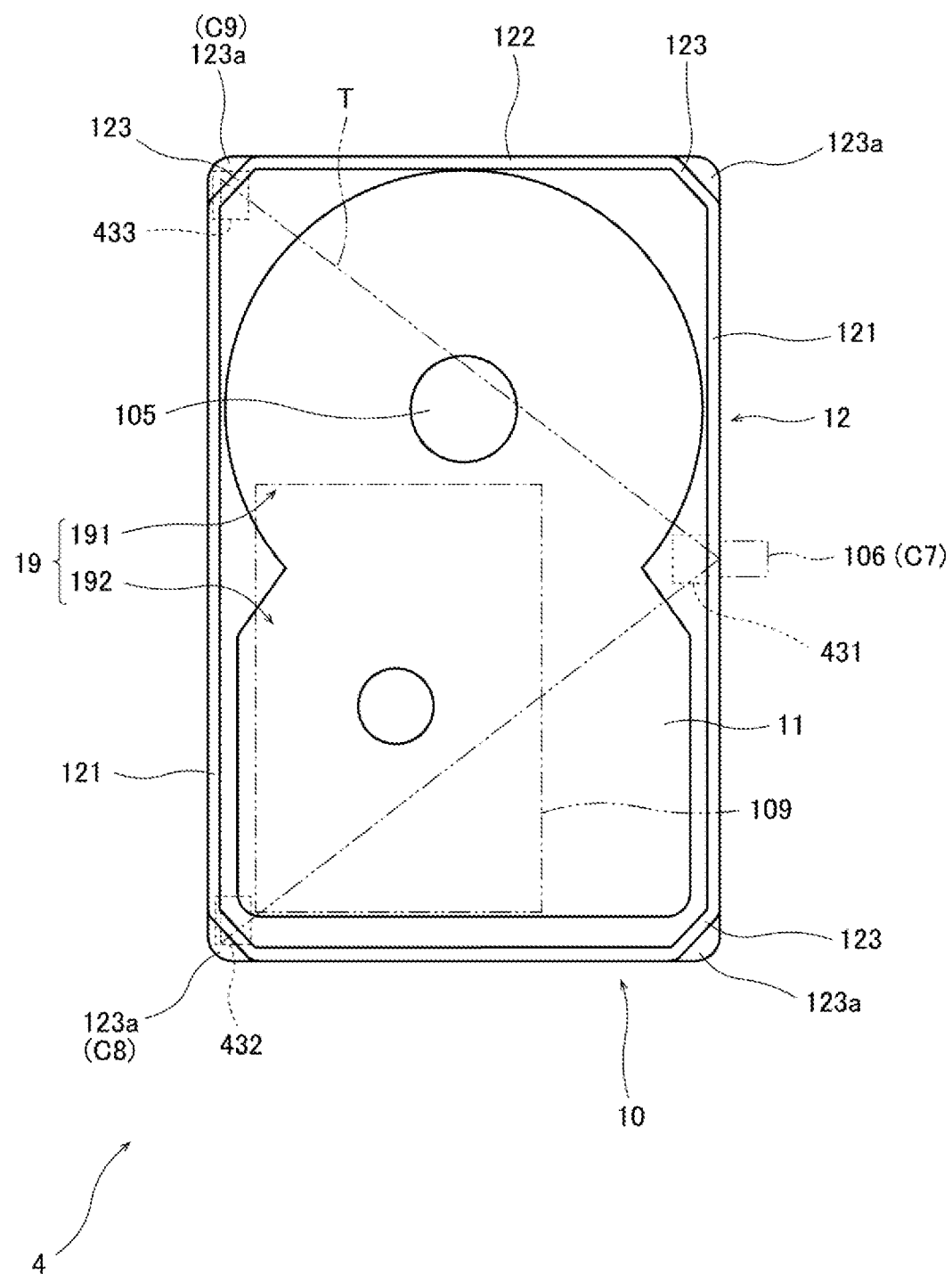
FIG. 9 is a top view that presents a configuration of a base plate according to a fourth embodiment preferred embodiment of the present invention.

The configuration of a base plate 4 according to the fourth embodiment will be explained below with reference to FIG. 9. FIG. 9 is a top view that schematically presents the configuration of the base plate 4 according to the present embodiment.

The base plate 4 according to the present embodiment includes a processing surface (not shown) that is a trace of the protruding portion 160 in the long side wall portion 121 of a side that is opposite to the side on which a circuit board 109, which operates and controls the access portion 104 and the like, is arranged, which is one side of the long side wall portion 121. In other words, a processing surface as a trace of the protruding portion 160 is provided in the long side wall portion 121 of one that has a room in space of the pair of long side wall portions 121. The upper surface of the protruding portion 160 that existed outside of the processing surface functions as a clamp surface C7. In addition, the stepped surfaces 123a of the both end portions of the longitudinal direction of the long side wall portion 121 that is opposite to the long side wall portion 121 on which this processing surface is provided function as clamp surfaces C8 and C9.

The lower surface of the bottom plate portion 11 of the base plate 4 is provided with a datum surface 431, which corresponds to the protruding portion 160 (C7), and the datum surfaces 432 and 433, which correspond to the stepped surfaces 123a (C8 and C9). The datum surface 431 is provided in a neighborhood of the processing surface that is a trace of the protruding portion 160. The datum surface 432 is provided in a position that is substantially overlapping with the stepped surface 123a (C8) when viewed in the axial direction. The datum surface 433 is provided in a position that is substantially overlapping with the stepped surface 123a (C9) when viewed in the axial direction.

Also according to the present embodiment, in the cutting work (Step S7) after casting, it is possible to stably support a cast metal (base intermediate) by the three datum surfaces 431, 432, and 433 and it is possible to stably clamp the cast metal by the three clamp surfaces C7, C8, and C9 without generating deformation and warpage.

In addition, according to the configuration of the present embodiment, it is possible to lay out the protruding portion 160 and the datum surface 431 that corresponds to it with the part on which the circuit board 109 is arranged being avoided. Therefore, it is possible to carry out an accurate cutting work with respect to the cast metal without making a significant change in the layout and the like of the conventional circuit board 109.

While some of the embodiments of the present disclosure have been explained so far, the present disclosure is not limited to the embodiments described above, and a variety of other variations may be made to those described above without departing from the scope of the present disclosure.

While in the embodiments described above, the processing surface 16, which is a trace of the protruding portion 160, is provided in the center portion of the longitudinal direction of the long side wall portion 121 or the short side wall portion 122, the present disclosure is not limited to this. Namely, in place of the embodiments described above, the processing surface 16, which is a trace of the protruding portion 160, may be provided in a position that is offset with respect to the center portion of the longitudinal direction of the long side wall portion 121 or the short side wall portion 122. In other words, the position in which the processing surface 16 is provided may be a position that is displaced from the center of the longitudinal direction of the long side wall portion 121 or the short side wall portion 122. According to this configuration, it is possible to flexibly lay out a datum surface that corresponds to the processing surface 16 in an appropriate position of the lower surface of the bottom plate portion 11 so as not to overlap with the position on which the circuit board 109 and another member are mounted with respect to the base plate 1. Therefore, the degree of freedom of design is improved.

Figure 10:
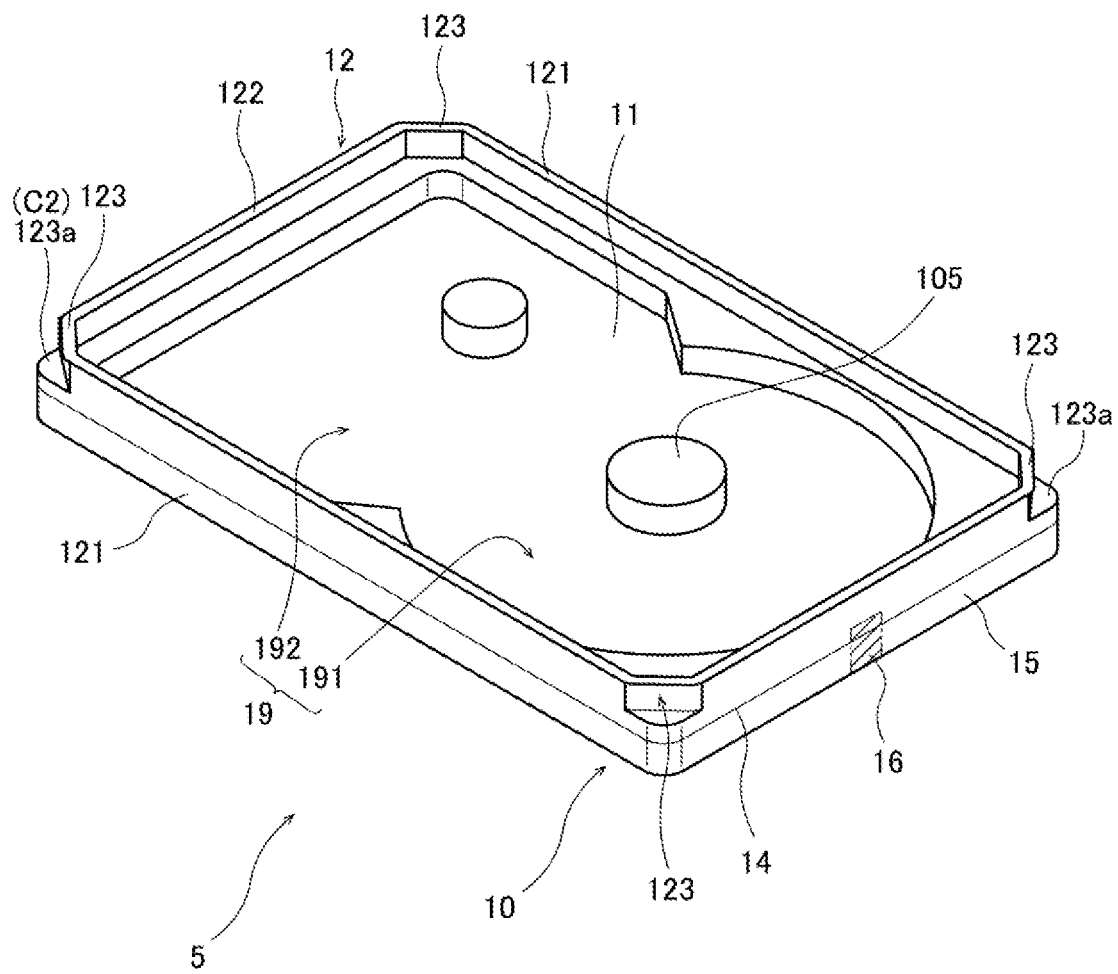
FIG. 10 is a perspective view of a base plate according to a variation of a preferred embodiment of the present invention.

FIG. 10 presents a perspective view of a base plate 5 according to a variation of the embodiment described above. As presented in FIG. 10, the processing surface 16 may extend in the axial direction from the lower end of the short side wall portion 122 to a position that exceeds the parting line 14. Alternatively, although not shown in the drawing, the processing surface may extend from the upper end of the short side wall portion or the long side wall portion to a position that exceeds the parting line 14. According to this configuration, it is possible to increase the thickness of the axial direction of the protruding portion 160, and hence it is made possible to clamp the cast metal with a greater force at the time of cutting work (Step S7) of the wall portion 12. In addition, it causes a defect such as that the protruding portion 160 breaks due to an unintentional contact with the outside environment in the middle of the production process of the base plate 1 to be unlikely to occur. Furthermore, it is possible to use in a manner where, for instance, the upper end face of the protruding portion 160 is caused to function as a clamp surface and the lower end face of the protruding portion 160 is caused to function as a datum surface. As a result, it is possible to carry out an efficient cutting process and thus the productivity of the base plate is improved.

It is to be noted that if allowed in terms of tolerance and geometric tolerance, the datum surface may be arranged inside of the virtual triangle T, which is formed with the three clamp surfaces as vertices in the planar view, or may be arranged outside thereof.

The cast metal (base intermediate) may be clamped by using a pair of protruding portions (not shown) that extended outward from each of the pair of long side wall portions 121 to the outside, in addition to the protruding portion 160 of the first embodiment. In that case, the pair of protruding portions may be cut down in the process of Step S8 together with the protruding portion 160.

Each of the elements appeared in the embodiments and the variations described above may be combined as appropriate within a range where they are not inconsistent.

The present disclosure can be used in, for example, a base plate and a method for producing the base plate.

Features of the above-described preferred embodiments and the modifications thereof may be combined appropriately as long as no conflict arises.

While preferred embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. A base plate defining a portion of a housing of a disk drive device, the housing accommodating therein a disk, a spindle motor that rotationally drives the disk about a center axis that extends in a vertical direction, and an access portion that carries out at least one of reading or writing of information with respect to the disk, the base plate comprising:
   a base body that is a cast product; and
   an electrodeposition coating film that covers a surface of the base body; wherein
   the base body includes:
      a bottom plate portion that extend from the center axis to on outward in a radial direction; and
      a wall portion that extends upward from an outer circumference portion of the bottom plate portion and has a rectangular or substantially rectangular shape when viewed in an axial direction;
   an outside surface of the wall portion includes:
      a coated surface that is covered with the electrodeposition coating film;
      a processing surface which is flat and on which a casting material is exposed from the electrodeposition coating film; and
      a parting line; and
   the processing surface extends in an axial direction in contact with the parting line or across the parting line.

2. A base plate according to claim 1, wherein the wall portion includes:
   a pair of long side wall portions that correspond to a long side; and
   a pair of short side wall portions that correspond to a short side that is shorter than the long side; and
   the processing surface is located in an outside surface of any one of the long side wall portion and the short side wall portion.

3. A base plate according to claim 2, wherein
   the wall portion includes a corner wall portion that connects a connection point of the long side wall portion and the short side wall portion by a straight line that is inclined with respect to both of the long side wall portion and short side wall portion when viewed in an axial direction or a circular arc;
   the corner wall portion includes a stepped surface that is located outside of an area surrounded by the wall portion when viewed in an axial direction and below an upper end surface of the wall portion.

4. A base plate according to claim 3, wherein
   the processing surface is located in a center portion of a longitudinal direction of the long side wall portion or the short side wall portion; and
   the stepped surface is located in each of a pair of the corner wall portions of both end portions of a wall portion that is opposite to the long side wall portion or the short side wall portion in which the processing surface is located with respect to the center axis.

5. A base plate according to claim 4, wherein the processing surface is located in a center of a longitudinal direction of the short side wall portion.

6. A base plate according to claim 5, further comprising:
   a support portion that supports the spindle motor; wherein
   the processing surface is located in a short side wall portion of a side that is close to the support portion of the pair of short side wall portions.

7. A base plate according to claim 1, wherein the processing surface is offset with respect to a center portion of a longitudinal direction of the long side wall portion or the short side wall portion.

8. A base plate according to claim 1, wherein the processing surface extends in an axial direction from one of an upper end surface and a lower end surface of the wall portion to a position that exceeds the parting line.

9. A base plate according to claim 3, wherein a virtual triangle that is defined by the processing surface and two of the stepped surfaces as vertices when viewed in an axial direction is an isosceles triangle.

10. A method for producing a base plate, the base plate forming a portion of a housing of a disk drive device and including a bottom plate portion that extends perpendicularly or substantially perpendicularly with respect to a center axis, and a wall portion that extends in a rectangular or substantially rectangular shape when viewed in an axial direction upward from an outer circumference portion of the bottom plate portion, the method comprising:
   a) molding a cast metal that becomes the base plate in a later process by a pair of molds, the step a) including forming a protruding portion on an outside surface of the wall portion;
   b) after the step a), performing a cutting process on the cast metal, while the cast metal is supported with a clamping force in an axial direction being applied to the protruding portion; and
   c) after the step b), cutting down the protruding portion.

* * * * *